United States Patent [19]

Clark

[11] 4,031,478
[45] June 21, 1977

[54] DIGITAL PHASE/FREQUENCY COMPARATOR

[75] Inventor: James Monroe Clark, Cedar Grove, N.J.

[73] Assignee: International Telephone and Telegraph Corporation, Nutley, N.J.

[22] Filed: June 29, 1976

[21] Appl. No.: 700,931

[52] U.S. Cl. .......................... 328/134; 235/92 FQ
[51] Int. Cl.² .......................................... H03B 3/04
[58] Field of Search ............ 328/133, 134, 155, 55; 235/92 FQ

[56] References Cited

UNITED STATES PATENTS

| | | | |
|---|---|---|---|
| 3,922,610 | 11/1975 | Buchan et al. | 328/134 X |
| 3,989,931 | 11/1976 | Phillips | 328/134 X |

*Primary Examiner*—John S. Heyman

*Attorney, Agent, or Firm*—John T. O'Halloran; Alfred C. Hill

[57] ABSTRACT

Two D-type flip flops have a clock and a ¼-bit delayed clock coupled to the D inputs of respective ones of the two flip flops to provide a +/− phase error of a present sample of digital data coupled to the clock inputs of the two flip flops and a second signal indicating a large/small phase error of the present sample of the data. A third signal indicating a +/− phase error of a previous state of the data is provided and a fourth signal indicating a large/small error of the previous state of the data is provided. A read only memory is responsive to the first, second, third and fourth signals in accordance with a given set of rules to produce a phase error signal with a clockwise change of phase states of the data providing a negative frequency error signal and a counter-clockwise change of phase states of the data providing a positive frequency error signal.

10 Claims, 6 Drawing Figures

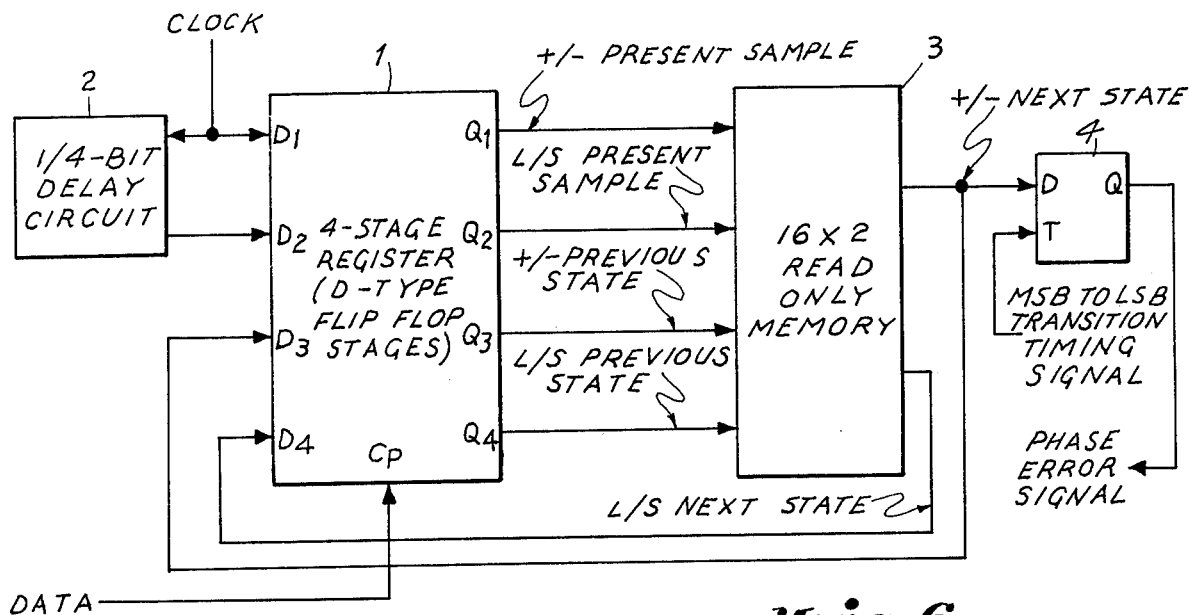
Fig. 4
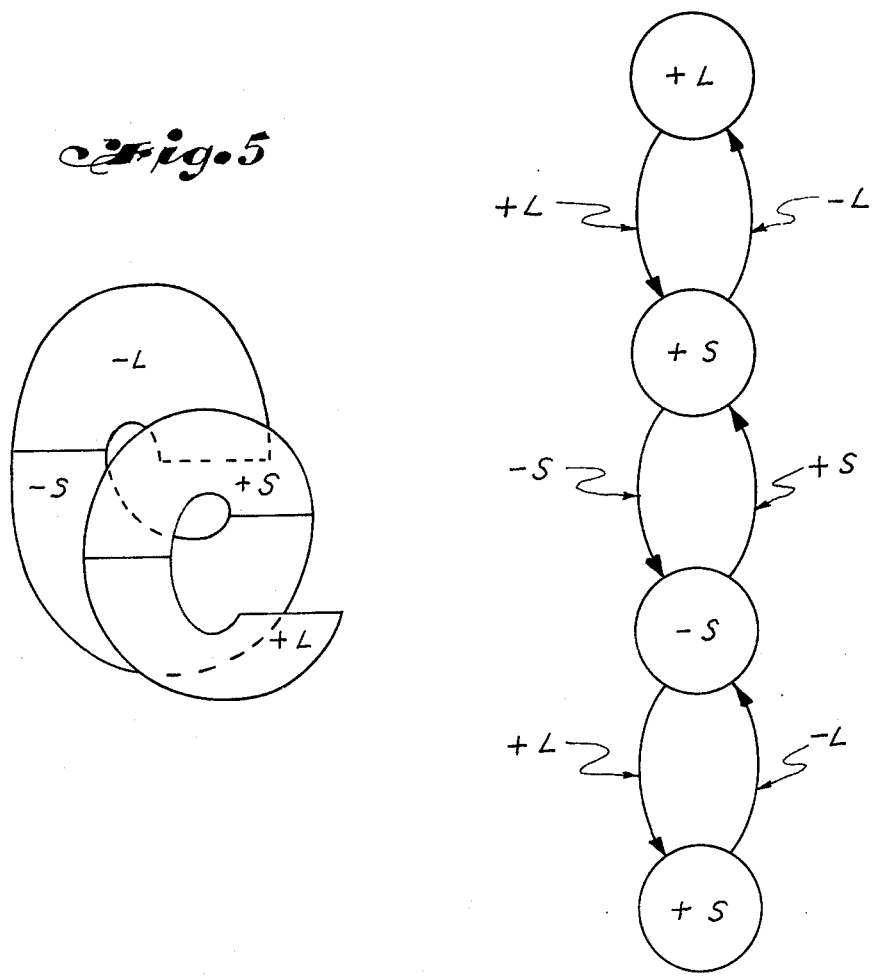
Fig. 5
Fig. 6

DIGITAL PHASE/FREQUENCY COMPARATOR

BACKGROUND OF THE INVENTION

This invention relates to phase comparators and more particularly to a phase comparator for a phase locked loop (PLL).

In prior art PLL's the phase comparator produces only error signals proportional to phase error and as a result the acquisition of the desired phase lock is relatively slow when the PLL is in an out-of-lock condition.

SUMMARY OF THE INVENTION

An object of the present invention is to provide a phase comparator that responds to phase error and frequency error in an out-of-lock condition to enable acquisition of the desired phase lock much quicker than with the prior art phase comparators.

Another object of the present invention is to provide a phase comparator responding to both phase and frequency error in an out-of-lock condition that compares a clock signal with an NRZ (non-return - to - zero) binary data signal.

A feature of the present invention is the provision of a digital phase/frequency comparator comprising: a first source of clock; a second source of digital data; first means coupled to the first and second sources to produce a first signal indicating a plus/minus phase error of a present sample of the data and a second signal indicating a large/small phase error of the present sample of the data; second means to provide a third signal indicating a plus/minus phase error of a previous state of the data and a fourth signal indicating a large/small phase error of the previous state of the data; and third means coupled to the first and second means responsive to the first, second, third and fourth signals in accordance with a given set of rules to produce a phase error signal, the first, second and third means cooperating to provide negative frequency errors for a clockwise change of phase states of the data and positive frequency errors for counter-clockwise changes of phase states of the date.

BRIEF DESCRIPTION OF THE DRAWING

Above-mentioned and other features and objects of this invention will become more apparent by reference to the following description taken in conjunction with the accompanying drawing, in which:

FIG. 4 illustrates an embodiment of the phase/frequency comparator in accordance with the principles of the present invention;

FIG. 5 illustrates the state condition of a second set of rules in accordance with TABLE II; and FIG. 6 is a state transition diagram of the phase/frequency comparator of the present invention for the second set of rules shown in TABLE II.

DESCRIPTION OF THE PREFERRED EMBODIMENT

Figure 1:
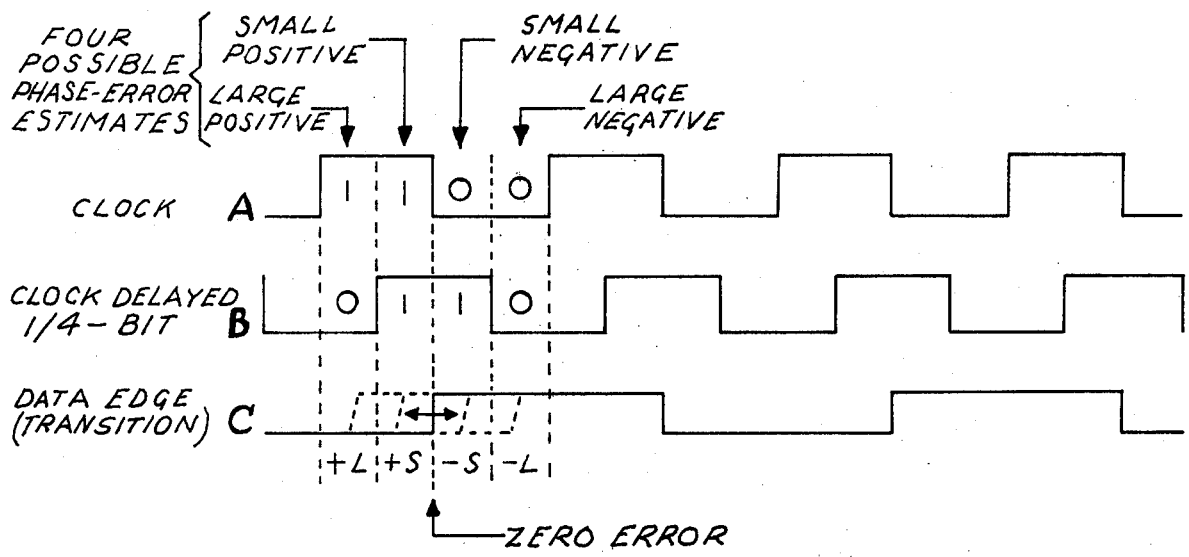
FIG. 1 is a timing diagram illustrating the principles of operation of the phase/frequency comparator in accordance with the principles of the present invention.

Referring to FIG. 1, in accordance with the principles of the present invention a phase comparator can be made to respond to frequency error as well as phase error by sampling a clock and a clock delayed ¼-bit period with one edge of the data signal, for example, the rising edges, and processing these samples with sequential logic to be described hereinbelow. The 2-bit code formed by these samples indicates whether the phase error is positive (+) or negative (−) and whether the phase error is large (L) or small (S). As the data edge moves relative to the clock, it samples different 2-bit codes: 10, 11, 01 and 00, also designated +L, +S, −S and −L. The phase comparator sequential logic also has two bit states also named +L, +S, −S and −L, to suggest a relation to the phase samples. The next state is a function of the previous state and the present sample as illustrated in TABLE I.

TABLE I

| PREVIOUS STATE | PRESENT SAMPLE | NEXT STATE | |
|---|---|---|---|
| +L | +L | +L | |
| +L | +S | +S | |
| +L | −S | +L | * |
| +L | −L | +L | * |
| +S | +L | +L | |
| +S | +S | +S | |
| +S | −S | −S | |
| +S | −L | −S | ++ |
| −S | +L | +S | ++ |
| −S | +S | +S | |
| −S | −S | −S | |
| −S | −L | −L | |
| −L | +L | −L | * |
| −L | +S | −L | * |
| −L | −S | −S | |
| −L | −L | −L | |

Figure 2:
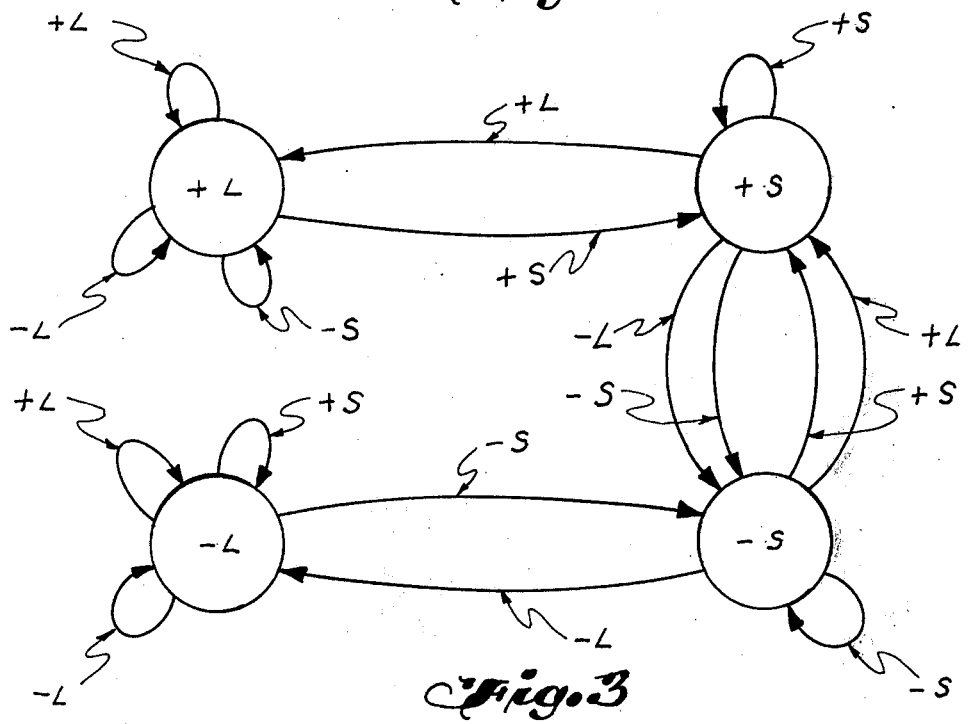
FIG. 2 illustrates a state transition diagram for the phase/frequency comparator in accordance with the principles of the present invention for a first set of rules set forth in TABLE I.

The rules given in Table I above are expressed pictorially in FIG. 2. The four circles represent the states, the arrows represent changes of state, and the labels on the arrows represent the phase sample which is the condition for making that state change. The position of the states in FIG. 2 are arranged to suggest the cyclic sequence of the corresponding phases shown in FIG. 3, wherein zero phase error is between +S and −S. Clockwise changes of phase represent negative frequency error and counter-clockwise changes of phase represent positive frequency error. By inspection of TABLE I and FIG. 2, it can be seen that in most cases, the next state is the same as the present sample. Exceptions are marked * or ++ in TABLE I. The exceptions marked * cause the state to become (+) whenever the frequency error is (+) (phase rotating counter-clockwise) and to remain (+) as long as the frequency error remains (+). The state can return to (−) only when the phase crosses the zero point in the opposite or clockwise direction. A similar but opposite relation holds for negative frequency error.

Only when the phase is very erratic (noisy) from poor received signal conditions will the sample phase change to a non-adjacent phase position, such as from +S to −L. The exceptions marked ++ in TABLE I provide for a minimal change through zero in such cases.

The phase/frequency comparator output will indicate whether the state is (+) or (−). When there is a frequency error (PLL out-of-lock), the output will indicate the direction of the frequency error. When there is a zero frequency error (PLL in-lock) the phase will normally dither between +S and −S, and the output will indicate the direction of the phase error.

Without the frequency detection capability, both (+) and (−) phase error is detected when out-of-lock. The loop is corrected in the proper direction (pulled into lock) only because the (+) phase error is detected slightly more often than (−) phase error when the frequency error is (+). A similar but opposite condition is present when the frequency error is (−). The corrective force (rate of pull-in) is thus much weaker than a steady indication of (+) or (−) as provided in the phase/frequency comparator discussed herein.

The implementation of the phase comparator in accordance with the principles of the present invention is illustrated in FIG. 4. The utilization of this implementation of the phase/frequency comparator of the present invention in a PLL is fully disclosed in my copending application Ser. No. 702,803, filed July 6, 1976, whose disclosure is incorporated herein by reference. As illustrated, the data is connected to the clock input CP, a four stage register 1 and the clock is digitally coupled to the first D-type flip flop stage of register 1 and through a ¼-bit delay circuit 2 to the second D-type flip flop stage of register 1. The $Q_1$ output of the first stage provides a signal representing the +/− phase error of a present sample of the data. The $Q_2$ output of the second stage of register 1 provides a signal indicating a large/small phase error of the present sample of the data. These signals are coded as illustrated in FIG. 1 and are coupled to a 16 × 2 read only memory 3. Memory 3 has a first output providing a signal representing a +/− error signal for the next state of the data and a second output providing a signal representing the large/small phase error of the next state of the data. These two outputs are coupled respective to the D input of the third and fourth D-type flip flop stages of register 1 to provide at their outputs signals representing conditions of the previous state of the data. The output from the third stage of register 1 is a signal representing the +/− error signal of the previous state of the data and the output from the fourth stage of register 1 is a signal representing the large/small error signal of the previous state of the data. The two signals for the present sample, the two signals for the previous state and the two signals for the next state are actually one of the 2-bit codes illustrated in FIG. 1.

The phase error signal from the comparator of this invention is provided by a D-type flip flop 4 whose D input is coupled to the +/− phase error signal of the next state of the data from memory 3 with the clock input of flip flop 4 being clocked by a timing signal representing the transition from the most significant bit (MSB) to the least significant bit (LSB).

The read only memory 3 is wired or coded according to TABLE I to provide the desired output as determined by the four inputs coupled thereto.

TABLE II

| PREVIOUS STATE | PRESENT PHASE | NEXT STATE |
|---|---|---|
| +L | +L | +S |
| +L | +S | +L |
| +L | −S | +L |
| +L | −L | +L |
| +S | +L | +S |
| +S | +S | +S |
| +S | −S | −S |
| +S | −L | +L |
| −S | +L | −L |
| −S | +S | +S |
| −S | −S | −S |
| −S | −L | −S |

TABLE II-continued

| PREVIOUS STATE | PRESENT PHASE | NEXT STATE |
|---|---|---|
| −L | +L | −L |
| −L | +S | −L |
| −L | −S | −L |
| −L | −L | −S |

Figure 3:
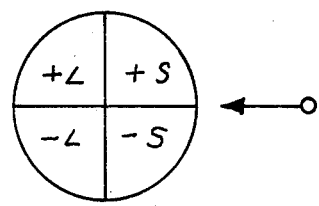
FIG. 3 illustrates the phases of the phase/frequency comparator in accordance with the principles of the present invention.

The above TABLE II illustrates a second set of rules that may be employed in the comparator of FIG. 4. The phases present in this set of rules are the same as shown in FIG. 3 while the states thereof are shown in FIG. 5. FIG. 6 illustrates the state transition diagram for TABLE II where the circles, arrows and labels coupled to the arrows have the same meaning as mentioned hereinabove with respect to FIG. 2. The only difference in the operation of FIG. 4 for TABLE II is that the read only memory 3 is coded or wired according to TABLE II rather than TABLE I.

While I have described above the principles of my invention in connection with specific apparatus it is to be clearly understood that this description is made only by way of example and not as a limitation to the scope of my invention as set forth in the objects thereof and in the accompanying claims.

I claim:

1. A digital phase/frequency comparator comprising:
a first source of clock;
a second source of digital data;
first means coupled to said first and second sources to produce a first signal indicating a plus/minus phase error of a present sample of said data and a second signal indicating a large/small phase error of said present sample of said data;
second means to provide a third signal indicating a plus/minus phase error of a previous state of said data and a fourth signal indicating a large/small phase error of said previous state of said data; and
third means coupled to said first and second means responsive to said first, second, third and fourth signals following a given set of rules determined by a predetermined logic to produce a phase error signal,
said first, second and third means cooperating to provide negative frequency errors for a clockwise change of phase states of said data and positive frequency errors for counter-clockwise changes of phase states of said data.

2. A comparator according to claim 1, wherein said third means includes
a read only memory wired according to said set of rules coupled to said first and second means responsive to said first, second, third and fourth signals, said memory having a first output providing thereon a first output signal in accordance with said set of rules indicating a plus/minus phase error of a next state of said data and a second output providing thereon a second output signal in accordance with said set of rules indicating a large/small phase error of said next state of said data, and
a D-type flip flop coupled to said first output responsive to said first output signal and most significant bit to least significant bit transition timing signals to produce said phase error signal.

3. A comparator according to claim 2, wherein said first means includes a delay circuit having a ¼-bit delay coupled to said first source to delay said clock ¼-bit, and one pair of stages of a four stage register having its clock input coupled to said second source, one of said one pair of stages being coupled to said first source to produce said first signal for coupling to said memory and the other of said one pair of stages being coupled to said delay circuit to produce said second signal for coupling to said memory.

4. A comparator according to claim 3, wherein said second means includes the other pair of stages of said register, one of said other pair of stages being coupled to said first output of said memory to produce said third signal for coupling to said memory and the other of said other pair of stages being coupled to said second output of said memory to produce said fourth signal for coupling to said memory.

5. A comparator according to claim 4, wherein each of said stages of said register is a D-type flip flop.

6. A comparator according to claim 1, wherein said first means includes a delay circuit having a ¼-bit delay coupled to said first source to delay said clock ¼-bit, and one pair of stages of a four stage register having its clock input coupled to said second source, one of said one pair of stages being coupled to said first source to produce said first signal for coupling to said memory and the other of said one pair of stages being coupled to said delay circuit to produce said second signal for coupling to said memory.

7. A comparator according to claim 5, wherein said third means further produces a fifth signal in accordance with said set of rules indicating a plus/minus phase error of a next state of said data and a sixth signal in accordance with said set of rules indicating a large/small phase error of said next state of said data, and said second means includes the other pair of stages of said register, one of said other pair of stages being coupled to said third means to store said fifth signal to produce said third signal for coupling to said third means and the other of said other pair of stages being coupled to said third means to store said sixth signal to produce said fourth signal for coupling to said third means.

8. A comparator according to claim 7, wherein each of said stages of said register is a D-type flip flop.

9. A comparator according to claim 1, wherein said third means further produces a fifth signal in accordance with said set of rules indicating a plus/minus phase error of a next state of said data and a sixth signal in accordance with said set of rules indicating a large/small phase error of said next state of said data, and said second means includes a pair of flip flops, each having their clock input coupled to said second source, one of said pair of flip flops being coupled to said third means to store said fifth signal to produce said third signal for coupling to said third means and the other of said pair of flip flops being coupled to said third means to store said sixth signal to produce said fourth signal for coupling to said third means.

10. A comparator according to claim 9, wherein each of said flip flops is a D-type flip flop.

* * * * *